United States Patent
Sun et al.

(10) Patent No.: US 10,304,725 B2
(45) Date of Patent: May 28, 2019

(54) MANUFACTURING METHODS TO PROTECT ULK MATERIALS FROM DAMAGE DURING ETCH PROCESSING TO OBTAIN DESIRED FEATURES

(71) Applicant: Tokyo Electron Limited, Minato-ku, Tokyo, (JP)

(72) Inventors: Xinghua Sun, Clifton Park, NY (US); Takashi Yamamura, Watervliet, NY (US); Hiroyuki Nagai, Nirasaki (JP); Ryuichi Asako, Nirasaki (JP); Katie Lutker-Lee, Niskayuna, NY (US)

(73) Assignee: Tokyo Electron Limited, Tokyo (JP)

( * ) Notice: Subject to any disclaimer, the term of this patent is extended or adjusted under 35 U.S.C. 154(b) by 32 days.

(21) Appl. No.: 15/665,515

(22) Filed: Aug. 1, 2017

(65) Prior Publication Data

US 2018/0061700 A1 Mar. 1, 2018

Related U.S. Application Data

(60) Provisional application No. 62/380,006, filed on Aug. 26, 2016, provisional application No. 62/515,624, filed on Jun. 6, 2017.

(51) Int. Cl.
*H01L 21/02* (2006.01)
*H01L 21/768* (2006.01)
(Continued)

(52) U.S. Cl.
CPC .... *H01L 21/76808* (2013.01); *H01L 21/0228* (2013.01); *H01L 21/02063* (2013.01);
(Continued)

(58) Field of Classification Search
CPC .......... H01L 21/0228; H01L 21/76808; H01L 21/02164; H01L 21/02063;
(Continued)

(56) References Cited

U.S. PATENT DOCUMENTS 7,485,690 B2    2/2009  Hamada et al.
7,727,882 B1 *  6/2010  Wu ..................... H01L 21/2855
                                                257/E21.584
(Continued)

FOREIGN PATENT DOCUMENTS

JP       4367636 B2      11/2009
KR    20090067596 A       6/2009

OTHER PUBLICATIONS

International Search Authority, International Search Report issued in counterpart Application No. PCT/US2017/046132 dated Nov. 20, 2017, 7 pp.

*Primary Examiner* — Jasmine J Clark
(74) *Attorney, Agent, or Firm* — Wood Herron & Evans LLP

(57) ABSTRACT

Embodiments are disclosed for processing microelectronic workpieces having patterned structures that include ultra-low dielectric constant (k) (ULK) material layers. In particular, embodiments are disclosed that deposit protective layers to protect ULK features during etch processing of patterned structures within substrates for microelectronic workpieces. For certain embodiments, these protective layers are deposited in-situ within the etch chamber.

25 Claims, 8 Drawing Sheets

(51) Int. Cl.
*H01L 23/522* (2006.01)
*H01L 23/532* (2006.01)

(52) U.S. Cl.
CPC .. *H01L 21/02164* (2013.01); *H01L 21/76814* (2013.01); *H01L 21/76816* (2013.01); *H01L 21/76831* (2013.01); *H01L 21/76877* (2013.01); *H01L 23/5226* (2013.01); *H01L 23/53228* (2013.01); *H01L 23/53295* (2013.01); *H01L 2221/1026* (2013.01)

(58) Field of Classification Search
CPC ......... H01L 21/76814; H01L 21/76816; H01L 21/76831; H01L 23/5226; H01L 23/53228; H01L 23/53295; H01L 21/1026; H01L 2221/1026
See application file for complete search history.

(56) References Cited

U.S. PATENT DOCUMENTS

| | | | |
|---|---|---|---|
| 7,741,224 B2 | 6/2010 | Jiang et al. | |
| 7,816,253 B2 | 10/2010 | Chen et al. | |
| 8,951,911 B2 | 2/2015 | Naik et al. | |
| 2016/0079173 A1* | 3/2016 | Tung | H01L 23/53238 257/751 |

\* cited by examiner

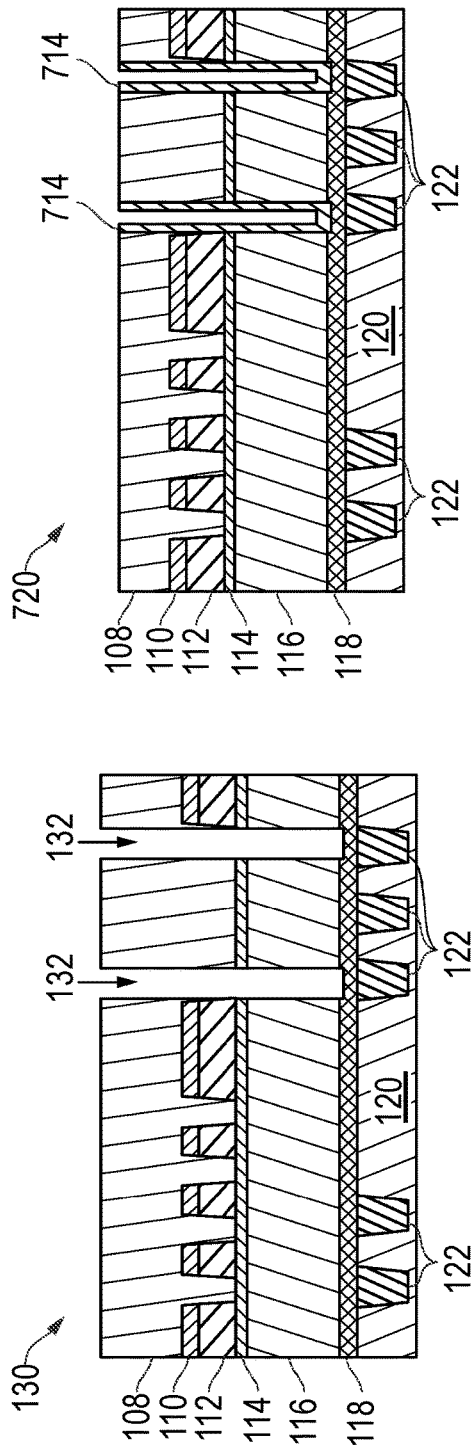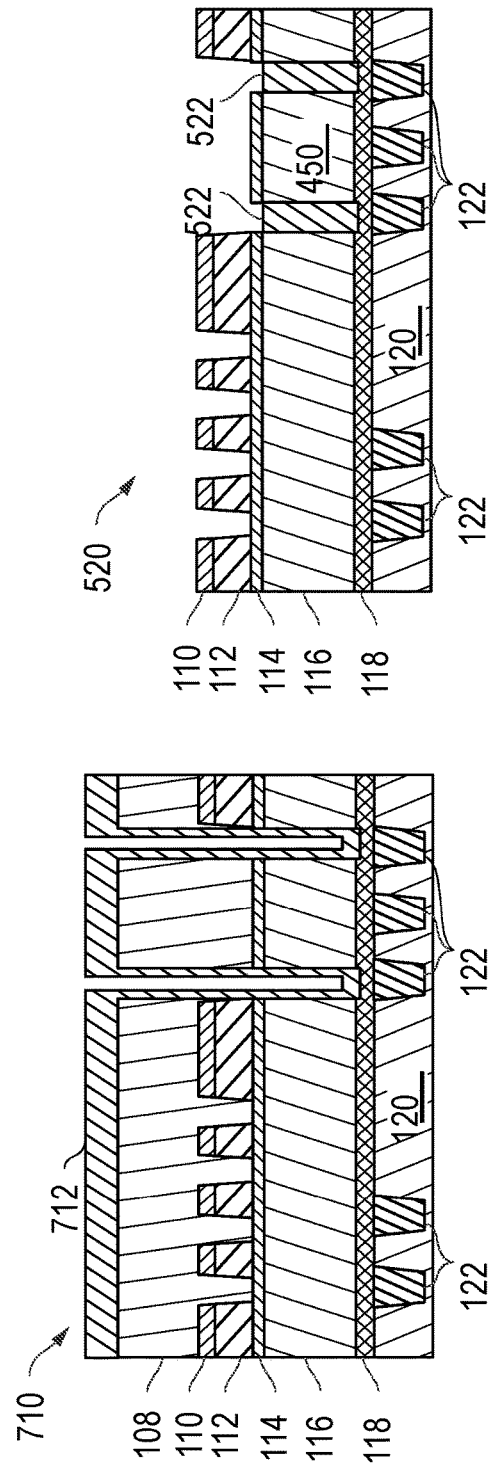
FIG. 7A
FIG. 7B
FIG. 7C
FIG. 7D

MANUFACTURING METHODS TO PROTECT ULK MATERIALS FROM DAMAGE DURING ETCH PROCESSING TO OBTAIN DESIRED FEATURES

RELATED APPLICATIONS

This application claims priority to the following provisional application: U.S. Provisional Patent Application Ser. No. 62/380,006, filed on Aug. 26, 2016, and entitled "ALD-SiO2 Chamfer-Less-Flow for Dual Damascene Structure," which is hereby incorporated by reference in its entirety.

BACKGROUND

The present disclosure relates to methods for processing microelectronic workpieces, and in particular, methods for creating patterned structures on the microelectronic workpieces.

Semiconductor device formation involves a series of manufacturing techniques related to the formation, patterning and removal of a number of layers of material on a substrate. To meet the physical and electrical specifications of current and next generation semiconductor devices, processing flows are being requested to improve various performance parameters, such as for example resistance-capacitance (RC) delay, power consumption, and reliability. For example, the integrity of ultra-low dielectric (k) (ULK) materials is one factor that impacts these characteristics for certain embodiments. Further, the integrity of the chamfer angle formed on the surfaces of features formed from ULK material (ULK features) that are included within the patterned structures is also an important specification for advanced fabrication. The ULK features can be easily damaged during the etching process by various species present in the plasma etch chemistry. This damage can detrimentally impact the k-value of the ULK material, thus having an adverse impact on the electrical performance of the resulting microelectronic devices. This damage can also impact the resulting profile and dimensions resulting from the etch processing for the microelectronic workpieces. In addition, the chamfer angle, particularly at smaller pitches, may also decrease and/or become rounded, which can further degrade the electrical performance and reliability of the resulting microelectronic devices being manufactured.

FIGS. 1A-D (Prior Art) provide example embodiments for a traditional process flow, such as a dual Damascene process flow, where ULK materials are often damaged in a plasma etch for forming trenches and one or more vias within a patterned structure. Looking first to FIG. 1A (Prior Art), an embodiment 100 for a patterned structure is shown that includes a ULK material layer 116. In particular, multiple electrical material layers are formed in a substrate 120. A protective liner 118 is formed to cover the substrate 120 and contact regions 122. The ULK material layer 116 is formed on the protective liner 118. A hard mask (HM) layer 114 is formed on top of the ULK material layer 116. A contact layer 112 and a second hard mask (HM) layer 110 are formed and patterned on top of the HM layer 114. An organic layer 108 is formed on top of the patterned layers 110/112/114 and fills in the patterned layers 110/112. A passivation layer 106 and anti-reflective coating (ARC) layer 104 are formed on top of the organic layer 108, respectively. Finally, a photoresist (PR) layer 102 is formed on top of the ARC and passivation layers 104/106, and PR layer 102 has been patterned to form openings 124. It is noted that additional (or fewer) process flow steps could also be included, for example, as part of a dual Damascene process flow.

It is noted that the protective liner 118 can be, for example, one or more of the following materials including but not limited to SiN, $SiO_x$, SiC, nitrogen-doped silicon, metal oxides, metal nitrides, metal, NBLoK (nitrogen barrier low-k material), silicon carbide nitride (SiCN), and/or other desired protective liner materials. The ULK material layer 116 can be, for example, one or more of the following materials including but not limited to SiCOH, dense SiCOH, porous SiCOH, other porous dielectric materials, and/or other ULK materials. The HM layer 114 can be, for example, one or more of the following materials including but not limited to TEOS (tetraethyl orthosilicate), silicon oxide ($SiO_x$), low temperature silicon oxide, silicon nitride (SiN), sacrificial SiN, SiCOH, silicon oxynitride (SiON), and/or other hard mask materials. The contact layer 112 can be, for example, one or more of the following materials including but not limited to metal nitrides including titanium nitride (TiN), metal oxides, and/or other metal contact materials. The second HM layer 110 can be, for example, similar materials as used for the HM layer 114. The organic layer 108 can be, for example, one or more of the following materials including but not limited to OPL (organic planarizing layer), SOH, SOC, and/or other organic materials. The passivation layer 106 can be, for example, one or more of the following materials including but not limited to an amorphous silicon oxynitride (SiON) film, SiARC, SOG (spin on glass), low temperature oxide, silicon nitride, silicon oxide, silicon oxynitride, TEOS, and/or other passivation materials. The ARC layer 104 can be, for example, one or more of the following materials including but not limited to a silicon-based ARC material, a titanium-based ARC material, a BARC (bottom anti-reflective coating) material, similar materials used for the organic layer 108, and/or other ARC materials. The PR layer 102 can be, for example, a positive photoresist material or a negative photoresist. It is again noted that these are provided as example materials, and additional and/or different materials could also be used.

FIG. 1B (Prior Art) shows an embodiment 130 for the patterned structure once vias 132 have been formed within the patterned structure. The vias 132 extend at least partially through the ULK layer 116. For certain embodiments, the vias 132 can land on top of the protective liner 118 or extend partially into the protective liner 118. In addition, the passivation layer 106, the ARC layer 104, and the PR layer 102 have been removed. For the formation of vias 132, a plasma etch including standard dielectric and organic etch process steps can be used, and this plasma etch can include plasma containing fluorocarbons, oxygen, nitrogen, hydrogen, argon, and/or other gases. For example, a fluorine and carbon plasma dry etch can be used. In addition, this plasma etch can be done in a few steps with different discharged plasmas for directionally etching the passivation layer 106 and the ARC layer 104, which are then subsequently removed after the partial via formation to expose organic layer 108. Other variations could also be implemented.

FIG. 1C (Prior Art) shows an embodiment 140 for the patterned structure after the organic layer 108 has been removed. This removal of the organic layer 108 exposes the structure 142 that includes vias 132 that are adjacent the ULK feature 158. For removal of the organic layer 108, a standard ash process can be used to strip the organic layer 108, such as for example, one or more oxide and carbon plasma dry etch steps. For example, standard ash steps can be used including but not limited to plasma etches containing oxygen, carbon dioxide, carbon monoxide, nitrogen, hydrogen, methane, argon, and/or other gases. This ash process step could be also be performed by an ex-situ asher apparatus or systems. Other variations could also be implemented.

FIG. 1D (Prior Art) shows an embodiment 150 for the patterned structure after trenches 152 have been formed. As depicted, vias 132 have also been etched through the remaining portion of the protective liner 118 and into the contact regions 156 on either side of the resulting ULK feature 158. Chamfered corners 154 have also been formed on the edges of the ULK feature 158. These chamfered corners 154 are susceptible to damage during the etch processes that remove the organic layer 108 and produce the trenches 152. For the trench etch, a fluorine and carbon plasma etch can be used, and this plasma etch can include plasma containing fluorocarbons, oxygen, nitrogen, argon, hydrogen, methane, and/ or other gases. In addition, this plasma etch can be done in a few steps with different discharged plasmas for directional etching. Other variations could also be implemented.

For traditional back end-of-line (BEOL) dual Damascene structure integration all-in-one-etch flow as shown in part with respect to FIGS. 1A-D (Prior Art), the chamfered corners 154 are extensively exposed to plasma etching by radical/ion bombardment during the trench etch process that forms the trenches 152 shown in FIG. 1D (Prior Art). For example, the chamfered corners 154 for the ULK feature 158 are often etched at a much faster rate than the ULK material at other areas of ULK feature 158, resulting in rounded and chopped structures at the chamfered corners 154. In addition, the ULK feature 158 can be damaged by the plasma organic strip etch processing that removes the organic layer 108 shown in FIG. 1B (Prior Art).

After the trench etch processing and the typical wet clean process that follows, the dual Damascene structure including the ULK feature 158 is typically metalized (e.g., using copper) by adding one or more metal layers through a metallization process. Due to the rounded and chopped chamfered corners 154 resulting from the trench etch process, the distance between the metal layer (e.g., copper) and the underneath contact becomes much shorter, which can cause undesired electrical shorts to occur thereby degrading performance and lifetime. As such, it is desirable to reduce the damage to the ULK feature 158.

SUMMARY

Embodiments are described for processing microelectronic workpieces having patterned structures that include ultra-low dielectric constant (k) (ULK) material layers. In particular, the disclosed embodiments deposit protective layers to protect ULK features during etch processing of patterned structures within substrates for microelectronic workpieces. For certain embodiments, these protective layers are deposited in-situ within the etch chamber.

For one embodiment, a method of processing microelectronic workpieces is disclosed including providing a substrate with a patterned structure including an organic layer and one or more ultra-low dielectric constant (ULK) features where the substrate is part of a microelectronic workpiece, performing an etch process on the patterned structure to expose the one or more ULK features, performing a deposition process to form a protective layer to protect the one or more ULK features, performing an organic ash process to strip the organic layer where the protective layer protects the one or more ULK features during the organic ash process, and performing an additional etch process to remove the protective layer where the protective layer protecting the one or more ULK features at least in part during the additional etch process.

In additional embodiments, the microelectronic workpiece is positioned within an etch chamber for a manufacturing system, and the deposition process is performed without removing the microelectronic workpiece from the etch chamber. In further embodiments, the deposition process includes an atomic layer deposition (ALD) of an oxide-containing layer on the patterned structure. In still further embodiments, the oxide-containing layer is a SiO2 film.

In additional embodiments, the organic ash process and the additional etch process each include a plasma etch process.

In additional embodiments, the etch process includes a via etch process to open one or more vias within the patterned structure adjacent the one or more ULK features. In further embodiments, the additional etch process includes a trench etch process to form one or more trenches and the one or more vias and to remove the protective layer, and the protective layer protects the one or more ULK features at least in part during the trench etch process.

In additional embodiments, a chamfer angle (θ) is formed within a surface for one or more corners of the one or more ULK features. In further embodiments, the chamfer angle (θ) is formed such that $85° \leq \theta \leq 90°$. In still further embodiments, the chamfer angle (θ) is formed such that $40° \leq \theta \leq 85°$.

In additional embodiments, the protective layer is partially removed after the deposition process to leave one or more pillars protecting the one or more ULK features. In further embodiments, the method also includes controlling a height for the one or more pillars using a thickness for the organic layer prior to the deposition process. In still further embodiments, the height for the one or more pillars is selected based upon a depth for the trench formed in the etch process.

In additional embodiments, the organic ash process partially removes the protective layer to leave one or more protective plugs to protect the one or more ULK features. In further embodiments, the protective layer is an organic film.

In additional embodiments, the deposition process forms a thin protective layer that covers the patterned structure and partially fills the one or more vias. In further embodiments, the thin protective layer is an organic film and wherein the organic ash process partially removes the thin protective layer. In still further embodiments, the deposition process and the organic ash process are cyclically repeated until the one or more vias are filled within the organic film leaving one or more protective plugs to protect the one or more ULK features.

In additional embodiments, the organic ash process is performed to remove the organic layer before the deposition process is performed to form the protective layer. In further embodiments, the organic ash process partially removes the protective layer to leave one or more protective plugs to protect the one or more ULK features. In still further embodiments, the protective layer is an organic film.

In additional embodiments, the method further includes performing a metallization process to form a metal layer over the ULK feature. In further embodiments, the metal layer includes copper.

In additional embodiments, the one or more ULK features have a dielectric constant (k) of 3.3 or less such that $k \leq 3.3$. In further embodiments, the one or more ULK features have a dielectric constant (k) of 2.0 to 3.3 such that $2.0 \leq k \leq 3.3$.

Different or additional features, variations, and embodiments can be implemented, if desired, and related systems and methods can be utilized, as well.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

FIGS. 7A-D provide an example process flow where thin protective layers are deposited in a series of steps to form protective plugs to protect ULK features after vias are formed within a patterned structure.

DETAILED DESCRIPTION

Embodiments are described for processing microelectronic workpieces having patterned structures that include ultra-low dielectric constant (k) (ULK) material layers. In particular, the disclosed embodiments deposit protective layers to protect ULK features during etch processing of patterned structures within substrates for microelectronic workpieces. For certain embodiments, these protective layers are deposited in-situ within the etch chamber.

As the semiconductor device industry moves to ever smaller critical dimensions, the necessity of developing new process flows that meet or exceed electrical, physical, and reliability specifications for the current and next generation devices has increased. As described above, two problems that have been encountered with these smaller critical dimensions for typical process flows are damage to ultra-low dielectric constant (k) (ULK) material layers during etch processing and chamfer angle degradation for resulting ULK features. The embodiments described herein provide methods by which both damage to ULK layers and damage to chamfer angles for ULK features can be addressed with a minimal change to the process throughput. For the described embodiments, a protective layer (e.g., organic film, oxide-containing layer, polymer layer, etc.) is deposited that partially or fully fills open features for a patterned structure that includes: (1) one or more ULK features, and (2) one or more vias or other structure types adjacent to the ULK feature(s) that expose sidewalls of the ULK feature(s). For certain embodiments, an etch chamber is used to deposit a protective layer (e.g., organic film, oxide-containing layer, polymer layer, etc.) in-situ within the etch chamber that partially or fully fills open features for a patterned structure that includes: (1) one or more ULK features, and (2) one or more vias or other structure types adjacent to the ULK feature(s) that expose sidewalls of the ULK feature(s). During subsequent etch process steps, the protective layer protects the ULK features from damage and protects one or more corners and/or sidewalls of the ULK features from erosion. As such, the disclosed embodiments significantly reduce undesired rounded edges for chamfered corners of the resulting ULK features. The disclosed embodiments can also be used to produce chamfer angles (θ, as showed in FIG. 5F) for the corners of ULK features between about 85° to about 90° (e.g., $85° \leq θ \leq 90°$). It is further noted that a chamfer angle near about 90° for a corner of a ULK feature is considered a chamfer-less corner and that a via adjacent to a ULK feature having a corner with a chamfer angle near about 90° is considered a chamfer-less via.

Figure 2:
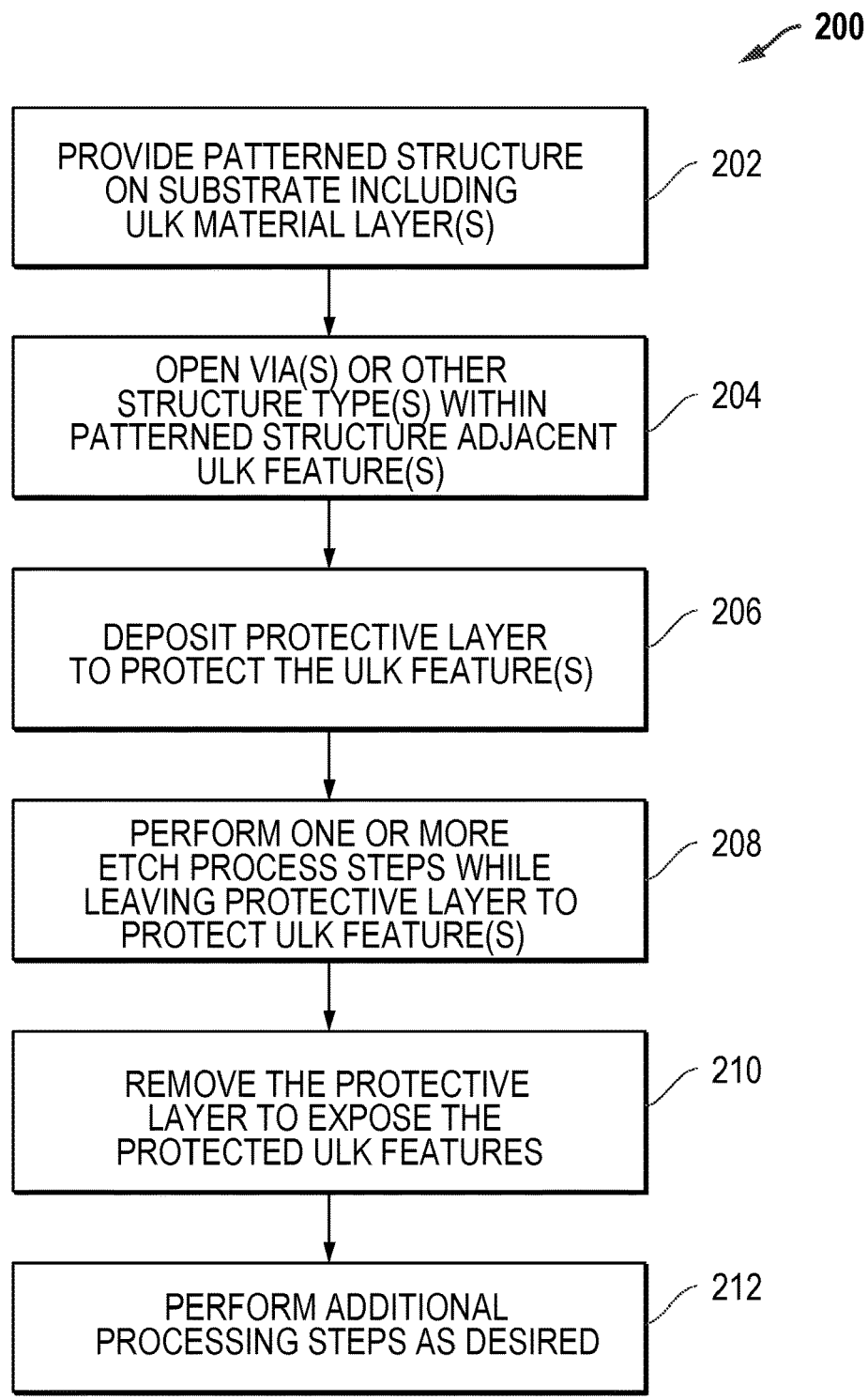
FIG. 2 is a flow diagram of an example embodiment for a manufacturing method that deposits a protective layer to protect ULK features.

FIG. 2 is a flow diagram of an example embodiment 200 for a manufacturing method that deposits a protective layer to protect ULK features. In block 202, a patterned structure is provided on a substrate for a microelectronic workpiece, and this patterned structure includes one or more ULK material layers. In block 204, one or more via(s) or other structure types are partially or fully opened within the patterned structure adjacent one or more ULK features. In block 206, a protective layer is deposited to protect the one or more ULK features. It is further noted that for certain embodiments, this deposition of a protective layer can be performed in-situ within the etch chamber (i.e., without removing the microelectronic workpiece from the etch processing chamber). In block 208, one or more additional etch process steps are performed while the protective layer at least in part protects the one or more ULK features. In block 210, the protective layer is removed, as needed or desired, to expose the one or more ULK features. In block 212, one or more additional process steps, such as additional etch process or metallization process steps, are performed as desired to further manufacture the microelectronic workpiece. It is further noted that for certain embodiments the additional etch process steps in block 208 as well as the removal of the protective layer in block 210 can also be performed in-situ within the etch chamber (i.e., without removing the microelectronic workpiece from the etch processing chamber).

It is noted that a variety of different materials can be used for the formation of ULK material layers. ULK materials are materials that have a dielectric constant that is very low with respect to the dielectric constant of silicon dioxide ($SiO_2$) which is 3.9. For example, materials having a dielectric constant of 3.3 or less (e.g., $k \leq 3.3$), and preferably having a dielectric constant of 2.0 to 3.3 (e.g., $2.0 \leq k \leq 3.3$), can be used as ULK material for formation of the ULK material layers described herein. Example materials include but are not limited to SiCOH, dense SiCOH, porous SiCOH, other porous dielectric materials, and/or other ULK materials having a dielectric constant (k) of 3.3 or less (e.g., $k \leq 3.3$), and preferably between 3.3 and 2.0 (e.g., $2.0 \leq k \leq 3.3$).

As described above, these ULK materials are susceptible to damage and/or degradation due to etch processing and related chemistries. In the disclosed embodiments, therefore, the workpiece manufacturing methods deposit a protective layer to partially or fully fill patterned structures before the etch process is continued in order to protect ULK features and one or more corners for ULK features from damage during subsequent etch process steps (e.g., ash process step, trench process step, etc.). For certain embodiments, this protective layer is deposited in-situ within the etch chamber. Because the deposition process is performed in-situ within an etch chamber for these embodiments without removing the microelectronic workpiece, process throughput is not significantly affected. In addition, the protective materials are compatible to the workpiece and they can be cleaned off during following process steps.

Further example process flows are described in more details with respect to FIGS. 4A-D, 5A-F, 6A-C and 7A-D although a wide variety of workpiece manufacturing processes can be implemented while still taking advantage of the protective layer deposition techniques described herein to protect ULK features. Before these example process flows are discussed, an embodiment 300 for an example plasma etch processing system is described with respect to FIG. 3. It is noted, however, that the techniques described herein may be utilized with a wide range of etch processing systems, and the embodiment 300 is simply one example embodiment.

Figure 3:
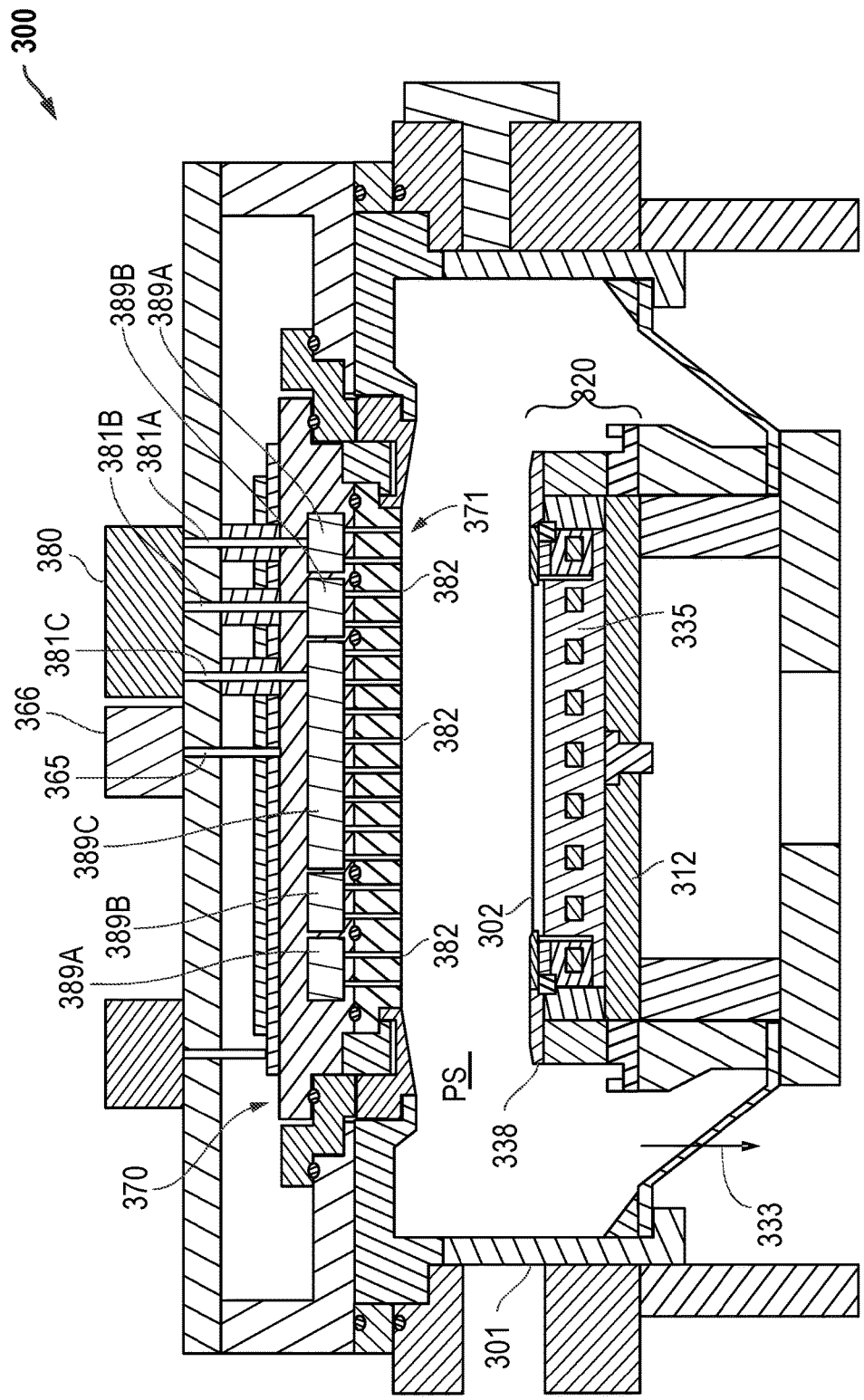
FIG. 3 is a block diagram of an example embodiment for a workpiece manufacturing system that can be used for the embodiments described herein.

FIG. 3 is a block diagram of an example embodiment 300 for a workpiece manufacturing system, such as a plasma processing apparatus, that can be used as an etch chamber for the embodiments described herein. More particularly, FIG. 3 illustrates one example embodiment for a plasma processing apparatus merely for illustrative purposes that can be used to implement the processing techniques described herein. It will be recognized that other plasma process systems and other etch process systems may equally implement the techniques described herein. For the example embodiment 300 of FIG. 3, a schematic cross-sectional view is provided for a capacitively coupled plasma processing apparatus including a process space (PS) that provides an etch chamber for microelectronic workpieces. Alternative plasma process apparatus may also be utilized, including for example, but not limited to, inductively coupled plasma processing apparatus, microwave plasma processing apparatus, and the like. A capacitively coupled plasma processing apparatus may be particularly well suited as the electrode spacing of such apparatus allow beneficial control of gases to a localized region of the plasma space, thus providing localized plasma processing on the substrate.

The plasma processing apparatus 300 can be used for multiple operations including ashing, etching, deposition, cleaning, plasma polymerization, plasma-enhanced chemical vapor deposition (PECVD), atomic layer deposition (ALD) and so forth. The structure of a plasma processing apparatus 300 is well known, and the particular structure provided herein is merely exemplary. Plasma processing can be executed within processing chamber 301, which can be a vacuum chamber made of a metal such as aluminum or stainless steel. The processing chamber 301 defines a processing vessel providing a process space (PS) for plasma generation. An inner wall of the processing vessel can be coated with alumina, yttria, or other protectant. The processing vessel can be cylindrical in shape or have other geometric configurations.

At a lower, central area within the processing chamber 301, a susceptor 312 (which can be disc-shaped) can serve as a mounting table on which, for example, a substrate 302 to be processed (such as a semiconductor wafer) can be mounted. Substrate 302 can be moved into the processing chamber 301 through a loading/unloading port and gate valve. Susceptor 312 forms part of a lower electrode assembly 320 as an example of a second electrode acting as a mounting table for mounting substrate 302 thereon. The susceptor 312 can be formed of, e.g., an aluminum alloy. Susceptor 312 is provided thereon with an electrostatic chuck (as part of the lower electrode assembly) for holding the substrate 302. The electrostatic chuck is provided with an electrode 335. Electrode 335 is electrically connected to direct current (DC) power source, not shown. The electrostatic chuck attracts the substrate 302 thereto via an electrostatic force generated when DC voltage from the DC power source is applied to the electrode 335. The susceptor 312 can be electrically connected with a high-frequency power source via a matching unit. For other embodiments and processing chambers, two or more power sources can be used and connected to electrode 335 and/or other electrodes within the processing chambers. This high-frequency power source (a second power source) can output a high-frequency voltage in a range from, for example, 2 MHz to 20 MHz. Applying high frequency bias power causes ions, in plasma generated in the processing chamber 301, to be attracted to substrate 302. A focus ring assembly 338 is provided on an upper surface of the susceptor 312 to surround the electrostatic chuck.

An exhaust path 333 can be formed through one or more exhaust ports (not shown) which connect to a gas exhaust unit. The gas exhaust unit can include a vacuum pump such as a turbo molecular pump configured to pump out the plasma processing space within the processing chamber 301 to a desired vacuum condition. The gas exhaust unit evacuates the inside of the processing chamber 301 thereby depressurizing the inner pressure thereof down to the desired degree of vacuum.

An upper electrode assembly 370 is an example of a first electrode and is positioned vertically above the lower electrode assembly 320 to face the lower electrode assembly 320 in parallel. The plasma generation space or process space (PS) is defined between the lower electrode assembly 320 and the upper electrode assembly 370. The upper electrode assembly 370 includes an inner upper electrode 371, having a disk shape, and an outer upper electrode which may be annular and surrounding a periphery of the inner upper electrode 371. The inner upper electrode 371 also functions as a processing gas inlet for injecting a specific amount of processing gas into the process space (PS) above substrate 302 mounted on the lower electrode assembly 320. The upper electrode assembly 370 thereby forms a shower head. More specifically, the inner upper electrode 371 includes gas injection openings 382.

The upper electrode assembly 370 may include one or more buffer chamber(s) 389A, 389B, and 389C. The buffer chambers are used for diffusing process gas and can define a disk-shaped space. Processing gas from a process gas supply system 380 supplies gas to the upper electrode assembly 370. The process gas supply system 380 can be configured to supply a processing gas for performing specific processes, such as film-forming, etching, and the like, on the substrate 302. The process gas supply system 380 is connected to gas supply lines 381A, 381B, and 381C forming a processing gas supply path. The gas supply lines are connected to the buffer chambers of the inner upper electrode 371. The processing gas can then move from the buffer chambers to the gas injection openings 382 at a lower surface thereof. A flow rate of processing gas introduced into the buffer chambers 389A-C can be adjusted by, e.g., by using a mass flow controller. Further, the processing gas introduced is discharged from the gas injection openings 382 of the electrode plate (showerhead electrode) to the process space (PS). The inner upper electrode 371 functions in part to provide a showerhead electrode assembly.

As shown in FIG. 3, three buffer chambers 389A, 389B, and 389C are provided corresponding to edge buffer chamber 389A, middle buffer chamber 389B, and center buffer chamber 389C. Similarly, gas supply lines 381A, 381B, and 381C may be configured as edge gas supply line 381A, middle gas supply line 381B and center gas supply line 381C. The buffer chambers are provided in a manner corresponding to different localized regions of the substrate in this case edge, middle and center. As will be discussed more below, these regions may correspond to specific process plasma process conditions for localized regions of the substrate 302. It will be recognized that the use of three localized regions is merely exemplary. Thus, the plasma processing apparatus may be configured to provide localize plasma process conditions on any number of regions of the substrate. It is further again noted that any of a variety of configurations may be utilized, and the techniques described herein are not limited to the manner in which the process gas supply system 380 is configured to split the gas flows to the various buffer chambers.

The upper electrode assembly 370 is electrically connected with a high-frequency power source (not shown) (first high-frequency power source) via a power feeder 365 and a matching unit 366. The high-frequency power source can output a high-frequency voltage having a frequency of 40 MHz (megahertz) or higher (e.g., 60 MHz), or can output a very high frequency (VHF) voltage having a frequency of 30-300 MHz. This power source can be referred to as the main power supply as compared to a bias power supply. It is noted for certain embodiments there is no power source for the upper electrodes, and two power sources are connected to the bottom electrode. Other variations could also be implemented.

Components of the plasma processing apparatus can be connected to, and controlled by, a control unit, which in turn can be connected to a corresponding memory storage unit and user interface (all not shown). Various plasma processing operations can be executed via the user interface, and various plasma processing recipes and operations can be stored in a storage unit. Accordingly, a given substrate can be processed within the plasma processing chamber with various microfabrication techniques. In operation, the plasma processing apparatus uses the upper and lower electrodes to generate a plasma in the process space (PS). This generated plasma can then be used for processing a target substrate (such as substrate 302 or any material to be processed) in various types of treatments such as plasma etching, chemical vapor deposition, treatment of semiconductor material, glass material and large panels such as thin-film solar cells, other photovoltaic cells, and organic/inorganic plates for flat panel displays, etc.

Looking now to drawings FIGS. 4A-D, 5A-F, 6A-C and 7A-D, additional example embodiments are provided that use protective layers deposited to protect ULK features during etch processing of patterned structures within a substrate for a microelectronic workpiece. For certain embodiments, this protective layer is deposited in-situ within the etch chamber. It is noted that the patterned structures and ULK features shown in these embodiments are merely example patterned structures and ULK features, and the disclosed techniques can be used for other patterned structures and ULK features as well. For example, while vias are shown as open structures formed adjacent ULK features in these drawings, it is understood that other structure types that expose sidewalls of the ULK features could also be formed while still taking advantage of the protective layer deposition techniques described herein to protect ULK features. It is further noted that additional and/or different process steps to those shown can also be implemented with respect to the microelectronic workpiece being manufactured while still taking advantage of the protective layer deposition techniques described herein to protect ULK features.

FIGS. 4A-D provide an example process flow where a protective layer is deposited to protect ULK features after vias are formed within a patterned structure.

Figure 1:
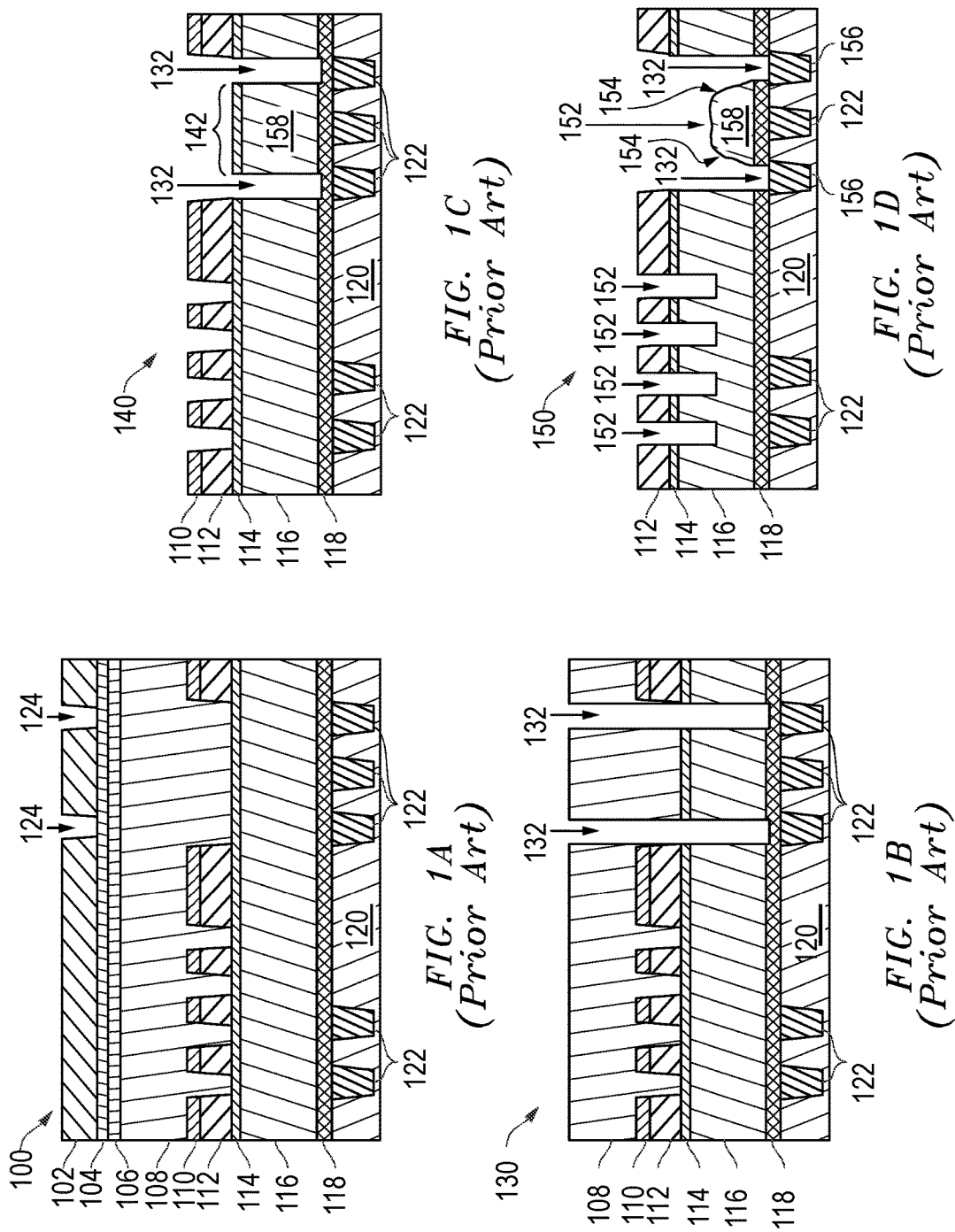
FIGS. 1A-D (Prior Art) provide example embodiments for a traditional process flow, such as a dual Damascene process flow, where ULK materials are often damaged in a plasma etch to form trenches and one or more vias within a patterned structure.
Figure 4A:
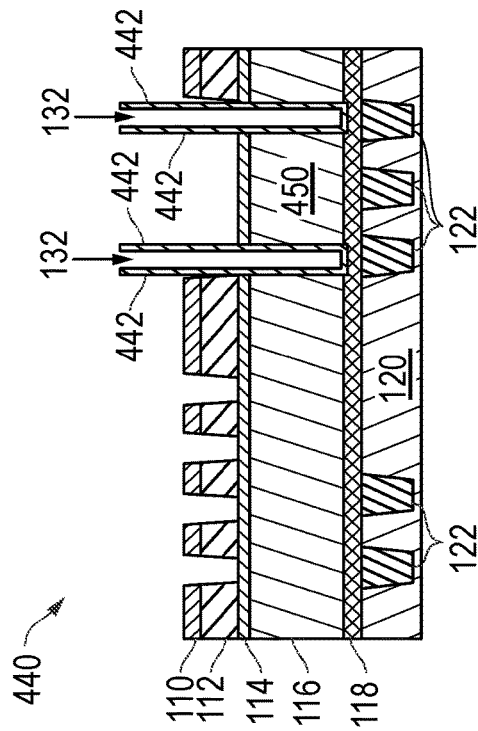
FIGS. 4A-D provide an example process flow where a protective layer is deposited to protect ULK features after vias are formed within a patterned structure.

FIG. 4A matches FIG. 1B (Prior Art) and shows embodiment 130 for a patterned structure after vias 132 have been formed within a patterned structure.

Figure 4B:
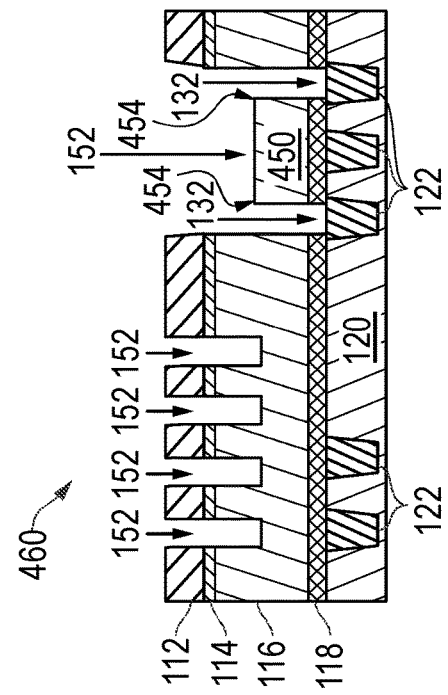

FIG. 4B shows an embodiment 430 where a protective layer 432 has been deposited over the patterned structure. For example, the protective layer 432 covers the vias 132 including the sidewalls of the exposed ULK layer 116. For certain embodiments, the protective layer 432 is deposited in-situ within the etch chamber (i.e., without removing the microelectronic workpiece from the etch processing chamber). For one example embodiment, an oxide-containing layer, such as a $SiO_2$ film, is deposited using atomic layer deposition (ALD), and this $SiO_2$ film covers the vias 132 including the sidewalls of the exposed ULK layer 116. For this ALD formation of the protective layer 432, $SiO_2$ can be deposited with a cycle of reactions including precursors, for example, diisopropylamino silane ($C_6H_{17}NSi$) and ozone ($O_3$), using a deposition temperature of within about 100 to about 450 degrees Celsius. It is noted that the techniques described herein are not limited to this example for depositing the protective layer 432 and other processes could also be implemented.

Figure 4C:
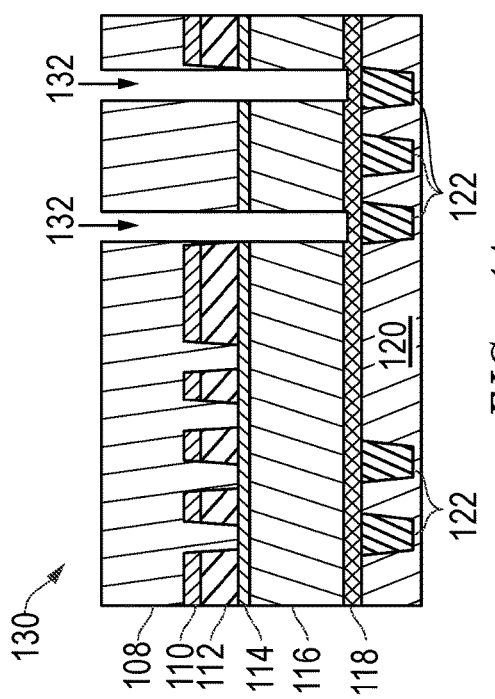

FIG. 4C shows an embodiment 440 for the patterned structure after organic layer 108 has been stripped leaving one or more protective pillars 442 along the sidewalls for the vias 132. These protective pillars 442 protect the ULK feature 450 from serious chopping and damage during the removal of the organic layer 108 and during subsequent trench etch processing. For this removal of the organic layer 108, standard ash steps can be used including but not limited to plasma etches containing oxygen, carbon dioxide, carbon monoxide, nitrogen, hydrogen, methane, argon, and/or other gases. This ash process step could be also be performed by an ex-situ asher apparatus or systems. Other variations could also be implemented. It is noted that this ash process is more of an isotropic process as compared to other typical etch process steps. As such, without the protective layer 432 and protective pillars 442, undesirable damage and/or degradation of the ULK feature 450 is likely to occur.

Figure 4D:
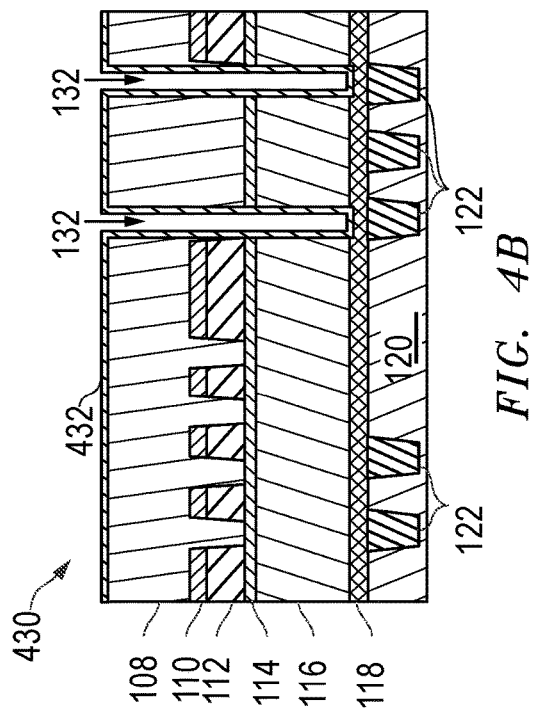

FIG. 4D shows an embodiment 460 for the patterned structure after a trench etch process step has occurred to form trenches 152 and further etch vias 132. The corners 454 for the ULK feature 450 have been protected and have chamfer angles (θ) of above about 85° to about 90° (e.g., 85°≤θ≤90°). As indicated above, a chamfer angle near about 90° represents a chamfer-less or near chamfer-less feature. As further described in more detail with respect to FIG. 5F, additional etch processing of the ULK feature can be used to form desired chamfer angles such as chamfer angles (θ) of between about 40° to about 85° (e.g., 40°≤θ≤85°). As described herein, the deposition of the protective layer 432, in FIG. 4B, as well as later formation of protective pillars 442, in FIG. 4C, protects the ULK feature 450 from damage and from undesired rounding to chamfer corners for the ULK feature 450 during removal of the organic layer 108 and the etch processing to form trenches 152, in FIG. 4D. In contrast, as described above with respect to FIG. 1D (Prior Art), prior techniques lead to damage to the ULK feature 158 and to the chamfered edges 154 for the ULK feature 158 during removal of organic layer 108 and trench etch to form trenches 152 and further etch vias 132.

It is noted that the height for pillars 442 in FIG. 4C can be controlled by the thickness of the organic layer 108 shown in FIG. 4B prior to the deposition of the protective layer 432. This height for pillars 442, for example, can be selected or optimized based on the depth for trenches 152 being formed in FIG. 4D, for example, to make sure the pillars 442 are etched off during this trench etch process step. It is noted that for one extreme case, all of organic layer 108 is removed (e.g., through an ash) and then the protective layer 432 is deposited. Other variations can also be implemented while still taking advantage of the protective layer deposition techniques described herein to protect ULK features.

FIGS. 5A-F provide an example process flow where a protective layer is deposited to form one or more protective plugs to protect ULK features after vias are formed within a patterned structure.

Figure 5A:
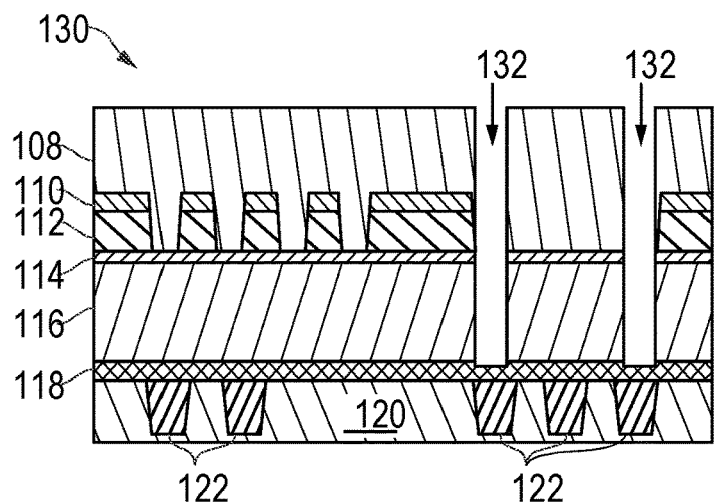
FIGS. 5A-F provide an example process flow where a protective layer is deposited to form protective plugs to protect ULK features after vias are formed within a patterned structure.

FIG. 5A matches FIG. 1B (Prior Art) and shows embodiment 130 for a patterned structure after vias 132 have been formed within a patterned structure.

Figure 5B:
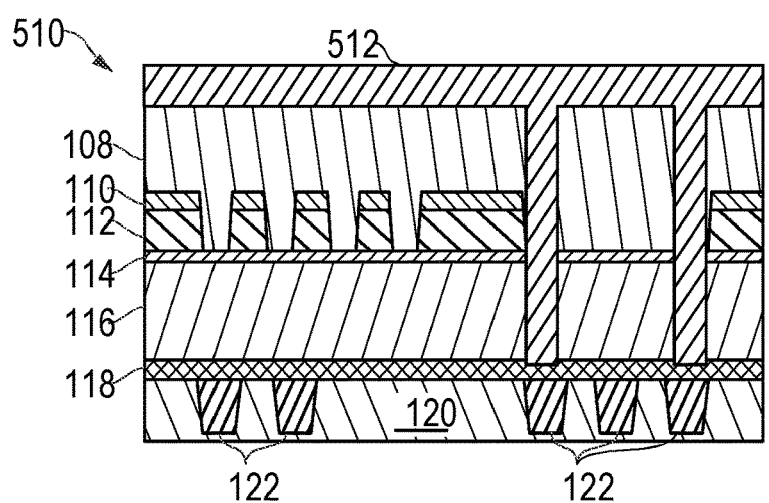

FIG. 5B shows an embodiment 510 where a protective layer 512 has been deposited over the patterned structure. In particular, the protective layer 512 fills the vias 132 that are shown in FIG. 5A. Preferably, the protective layer 512 is deposited in-situ in the etch chamber. For one example embodiment, prior to the removal of the organic layer 108 (e.g., using an ash step), an additional organic film is deposited in-situ within the etch chamber as protective layer 512. For this deposition process to form an additional organic film as the protective layer 512, a plasma process can be used in the etch chamber using a precursor gas mixture including but not limited to hydrocarbons, fluorocarbons, or nitrogen containing hydrocarbons in combination with one or more dilution gases (e.g., argon, nitrogen, etc.) at a variety of pressure, power, flow and temperature conditions. Other deposition processes could also be used, if desired.

Figure 5C:
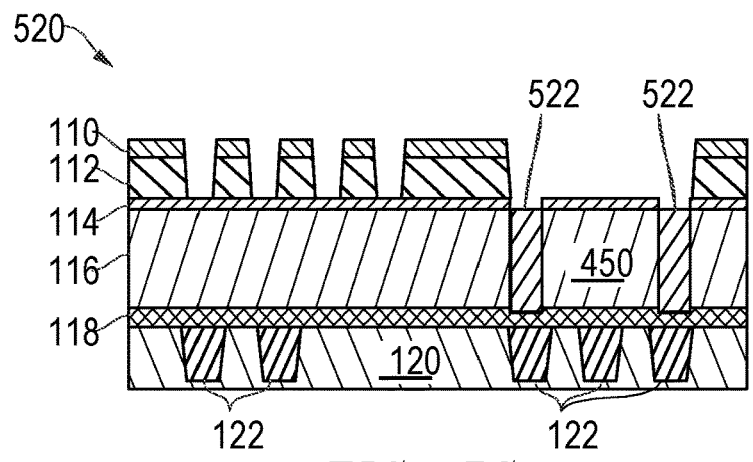

FIG. 5C shows an embodiment 520 for the patterned structure after organic layer 108 and a portion of the protective layer 512 has been stripped leaving protective plugs 522 next to the ULK feature 450. These protective plugs 522 protect the ULK feature 450 from serious corner loss and damage during the subsequent trench etch processing. For this removal of the organic layer 108 and partial removal of the protective layer 512, a plasma ash process can be used that includes standard ash chemistries including but not limited to nitrogen, hydrogen, argon, carbon dioxide, carbon monoxide, oxygen, methane, and/or other gases under a variety of pressure and power conditions. Other etch processes could also be used, if desired.

Figure 5D:
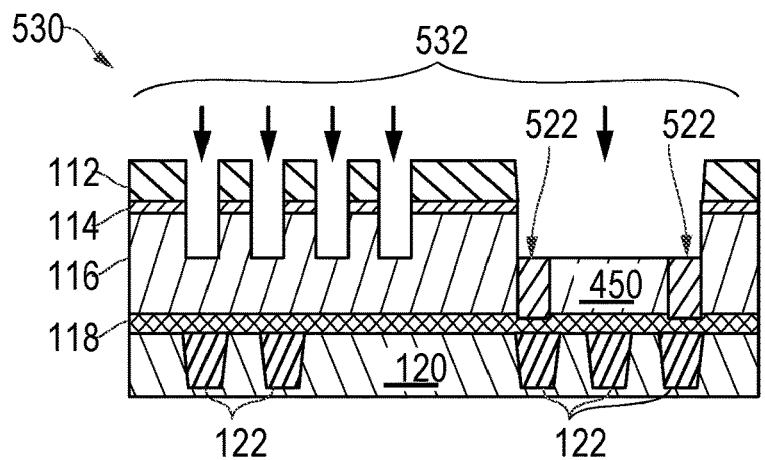

FIG. 5D shows an embodiment 530 for the patterned structure after a further etch process step has been used to form openings 532 including additional etching with respect to protective plugs 522 and ULK feature 450. For this additional etch processing, the protective plugs 522 protect the ULK feature 450 from damage. For this further etch processing, a standard dielectric plasma etch can be used that includes but is not limited to a fluorocarbon containing gas or gases combined with none, one, or more of the following gases (but not limited to) nitrogen, oxygen, argon, helium, hydrogen, methane, and/or other gases under of variety of pressure, power, temperature, and flow conditions. Other etch processes could also be used, if desired.

Figure 5E:
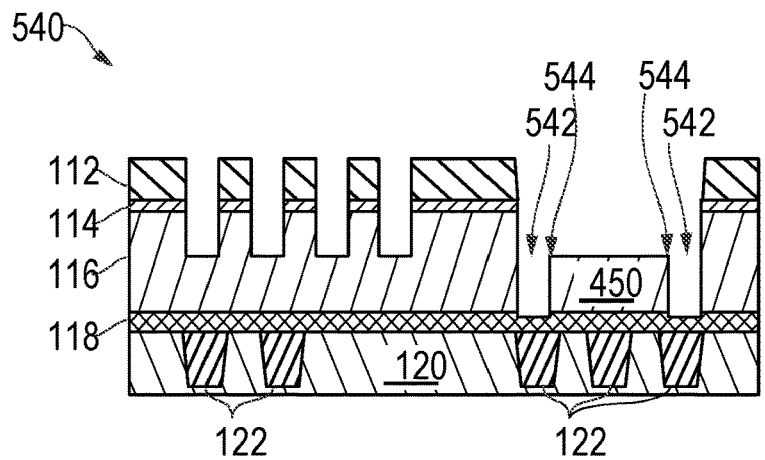

FIG. 5E shows an embodiment 540 for the patterned structure after a further etch process step has been used to remove the protective plugs 522 in order to form vias 542. The corners 544 for the ULK feature 450 have been protected and have chamfer angles (θ) of between about 85° to about 90° (e.g., 85°≤θ≤90°). As indicated above, a 90° angle represents a chamfer-less or near chamfer-less feature. For this further etch processing, a standard dielectric plasma etch can be used that includes but is not limited to a fluorocarbon containing gas or gases combined with none, one, or more of the following gases (but not limited to) nitrogen, oxygen, argon, helium, hydrogen, methane, and/or other gases under of variety of pressure, power, temperature, and flow conditions. It is noted that this etch process may or may not be followed by an ash process, as desired and/or as considered necessary. Other etch processes could also be used, if desired.

Figure 5F:
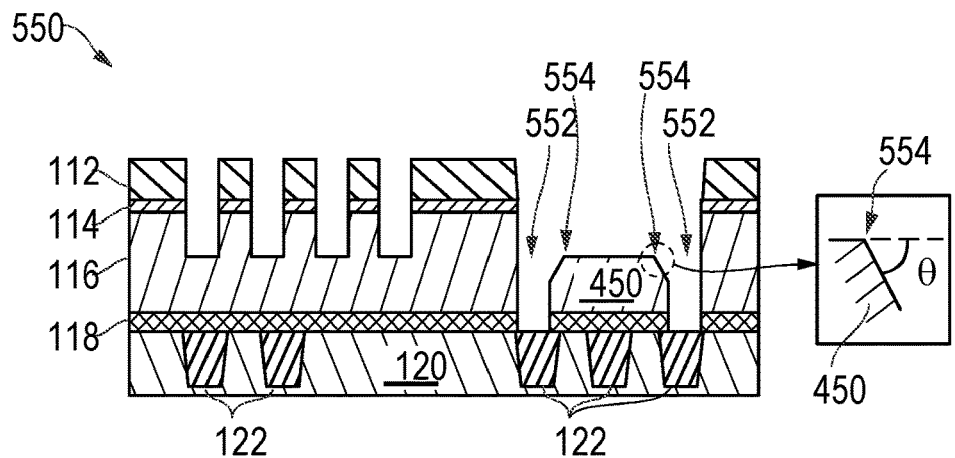

FIG. 5F shows an embodiment 550 for the patterned structure after a trench etch process step has occurred to form trenches 552. This further etch processing also etches the ULK feature 450 to form a desired chamfer angle for the corners 554 such as chamfer angle (θ) of between about 40° to about 85° (e.g., 40°≤θ≤85°) and such as a preferred chamfer angle (θ) of between about 60° for certain microelectronic workpieces. This further etch can include a defluorination or post etch treatment including but not limited to a plasma process using nitrogen, oxygen, hydrogen, carbon dioxide, carbon monoxide, methane, argon, and/or other gases under a variety of pressure, power, temperature, and flow conditions. Other etch processes could also be used, if desired.

Figure 6A:
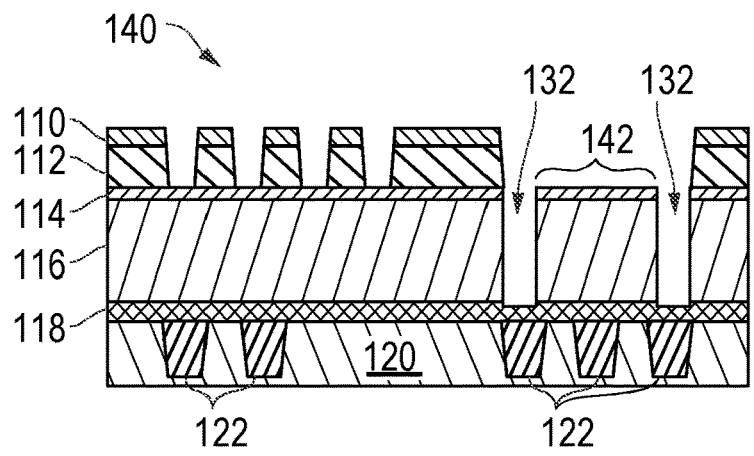
FIGS. 6A-C provide an example process flow where a protective layer is deposited to form protective plugs for ULK features after vias are formed and after removal of an overlying organic layer for a patterned structure.
Figure 6B:
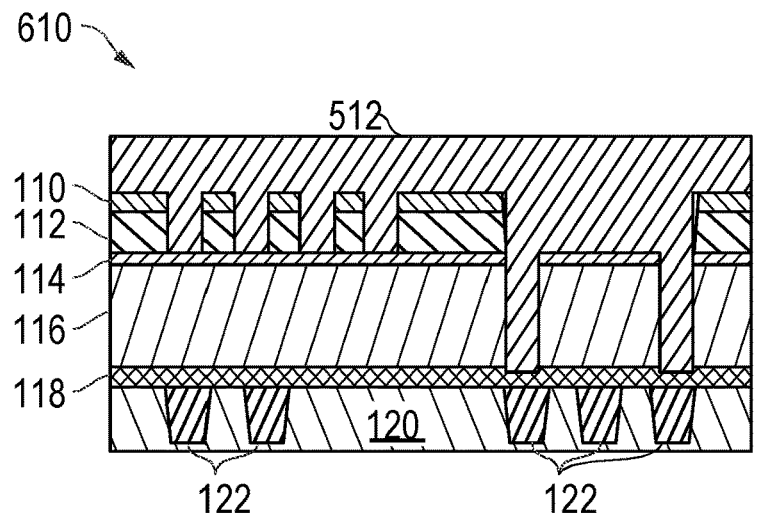
Figure 6C:
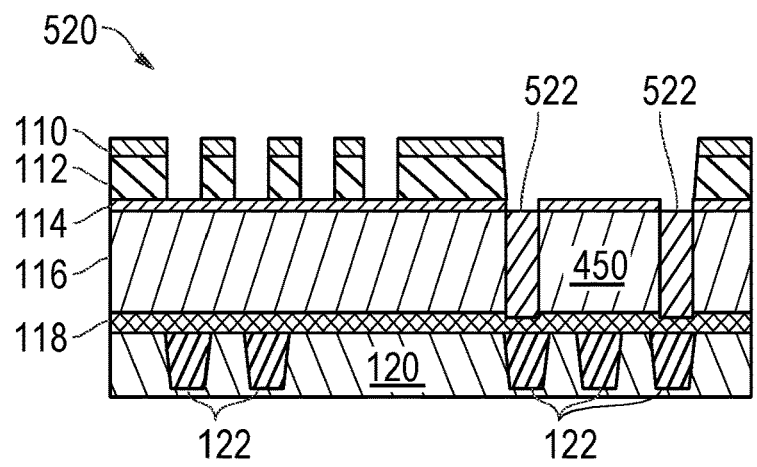

FIGS. 6A-C provide an example process flow where a protective layer is deposited to form protective plugs for ULK features after vias are formed and after removal of an overlying organic layer for a patterned structure.

FIG. 6A matches FIG. 1C (Prior Art) and shows embodiment 140 for a patterned structure after vias 132 have been formed and after the organic layer 108 has been removed.

FIG. 6B shows an embodiment 610 where a protective layer 512 has been deposited over the patterned structure. In particular, the protective layer 512 fills the vias 132 that are shown in FIG. 6A. For one example embodiment, an additional organic film is preferably deposited in-situ within the etch chamber as protective layer 512 to fill the vias 132 that are shown in FIG. 6A. For this deposition of the additional organic film as the protective layer 512, a plasma process can be used in the etch chamber using a precursor gas mixture including but not limited to hydrocarbons, fluorocarbons, or nitrogen containing hydrocarbons in combination with one or more dilution gases (e.g., argon, nitrogen, etc.) at a variety of pressure, power, flow and temperature conditions. Other deposition processes could also be used, if desired.

FIG. 6C shows an embodiment 520 where the patterned structure after the protective layer 512 has been partially stripped to leave protective plugs 522 next to the ULK feature 450. FIG. 6C matches the embodiment 520 of FIG. 5C. As described above, the protective plugs 522 protect the ULK feature 450 from serious corner loss and damage during the subsequent trench etch processing. For the partial removal of the protective layer 512, a plasma ash process can be used that includes standard ash chemistries including but not limited to nitrogen, hydrogen, argon, carbon dioxide, carbon monoxide, oxygen, methane, and/or other gases under a variety of pressure and power conditions. Other etch processes could also be used, if desired FIGS. 7A-D provide an example process flow where thin protective layers are deposited in a series of steps to form protective plugs to protect ULK features after vias are formed within a patterned structure.

FIG. 7A matches FIG. 1B (Prior Art) and shows embodiment 130 for a patterned structure after vias 132 have been formed within a patterned structure. It is also noted that the vias 132 can also be formed such that they extend completely through the protective liner 118.

FIG. 7B shows an embodiment 710 where a thin protective layer 712 has been deposited over the patterned structure. In particular, the thin protective layer 712 can be an additional organic film that is deposited to cover the vias 132 and exposed sidewalls of the ULK material layer 116. Preferably, the thin protective layer 712 is deposited in-situ in the etch chamber. For this deposition of the thin protective layer 712, a plasma process can be used in the etch chamber using a precursor gas mixture including but not limited to hydrocarbons, fluorocarbons, or nitrogen containing hydrocarbons in combination with one or more dilution gases (e.g., argon, nitrogen, etc.) at a variety of pressure, power, flow and temperature conditions. Other deposition processes could also be used, if desired.

FIG. 7C shows an embodiment 720 for the patterned structure after a partial removal process has left protective layers 714 along the sidewalls for the vias 132. For this partial removal, a plasma ash process can be used that includes standard ash chemistries including but not limited to nitrogen, hydrogen, argon, carbon dioxide, carbon monoxide, oxygen, methane, and/or other gases under a variety of pressure and power conditions. Other etch processes could also be used, if desired.

The process steps of FIGS. 7B and 7C can be repeated as needed until the vias 132 shown in FIG. 7A are completely filled and the organic layer 108 has been fully removed. It is noted that this cyclic process of thin layer deposition followed by partial etch is of particular use for patterned structures having high aspect ratio features as well as features that are small in size. In particular, these cycles of thin layer deposition followed by partial etch help to prevent pinch off of the material that is used to form the protective layers 714 that fill the vias 132 shown in FIG. 7A. As such, a more uniform fill of these vias 132 is achieved thereby providing for more uniform protective plugs 522 as shown in FIG. 7D.

FIG. 7D shows an embodiment 520 after organic layer 108 and a portion of the protective layers 714 have been stripped leaving protective plugs 522 next to the ULK feature 450. FIG. 7D matches the embodiment 520 of FIG. 5C. As described above for this embodiment, the protective plugs 522 are the result of the cyclic process in FIGS. 7B and 7C and protect the ULK feature 450 from serious chopping and damage during the subsequent trench etch processing.

It is noted that reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Microelectronic workpiece" as used herein generically refers to the object being processed in accordance with the invention. The microelectronic workpiece may include any material portion or structure of a device, particularly a semiconductor or other electronics device, and may, for example, be a base substrate structure, such as a semiconductor substrate or a layer on or overlying a base substrate structure such as a thin film. Thus, workpiece is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

The term "substrate" as used herein means and includes a base material or construction upon which materials are formed. It will be appreciated that the substrate may include a single material, a plurality of layers of different materials, a layer or layers having regions of different materials or different structures in them, etc. These materials may include semiconductors, insulators, conductors, or combinations thereof. For example, the substrate may be a semiconductor substrate, a base semiconductor layer on a supporting structure, a metal electrode or a semiconductor substrate having one or more layers, structures or regions formed thereon. The substrate may be a conventional silicon substrate or other bulk substrate comprising a layer of semi-conductive material. As used herein, the term "bulk substrate" means and includes not only silicon wafers, but also silicon-on-insulator ("SOI") substrates, such as silicon-on-sapphire ("SOS") substrates and silicon-on-glass ("SOG") substrates, epitaxial layers of silicon on a base semiconductor foundation, and other semiconductor or optoelectronic materials, such as silicon-germanium, germanium, gallium arsenide, gallium nitride, and indium phosphide. The substrate may be doped or undoped.

Systems and methods for annealing a microelectronic workpiece are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Further modifications and alternative embodiments of the described systems and methods will be apparent to those skilled in the art in view of this description. It will be recognized, therefore, that the described systems and methods are not limited by these example arrangements. It is to be understood that the forms of the systems and methods herein shown and described are to be taken as example embodiments. Various changes may be made in the implementations. Thus, although the inventions are described herein with reference to specific embodiments, various modifications and changes can be made without departing from the scope of the present inventions. Accordingly, the specification and figures are to be regarded in an illustrative rather than a restrictive sense, and such modifications are intended to be included within the scope of the present inventions. Further, any benefits, advantages, or solutions to problems that are described herein with regard to specific embodiments are not intended to be construed as a critical, required, or essential feature or element of any or all the claims.

What is claimed is:

1. A method of processing microelectronic workpieces, comprising:
   providing a substrate having a patterned structure that includes an organic layer and one or more ultra-low dielectric constant (ULK) features, the substrate being part of a microelectronic workpiece;
   performing an etch process on the patterned structure to expose the one or more ULK features;
   performing a deposition process to form a protective layer to protect the one or more ULK features;
   performing an organic ash process to strip the organic layer, the protective layer protecting the one or more ULK features during the organic ash process;
   performing an additional etch process to partially remove the protective layer, at least part of a remaining portion of the protective layer protecting the one or more ULK features at least in part during the additional etch process; and
   performing at least another additional etch process to remove the remaining protective layer.

2. The method of claim 1, wherein the microelectronic workpiece is positioned within an etch chamber for a manufacturing system, and wherein the deposition process is performed without removing the microelectronic workpiece from the etch chamber.

3. The method of claim 2, wherein the deposition process comprises an atomic layer deposition (ALD) of an oxide-containing layer on the patterned structure.

4. The method of claim 3, wherein the oxide-containing layer is a SiO2 film.

5. The method of claim 1, wherein the organic ash process and the additional etch process each comprises a plasma etch process.

6. The method of claim 1, wherein the etch process comprises a via etch process to open one or more vias within the patterned structure adjacent the one or more ULK features.

7. The method of claim 6, wherein the additional etch process comprises a trench etch process to form one or more trenches and the one or more vias and to partially remove the protective layer, at least part of the remaining portion of the protective layer protecting the one or more ULK features at least in part during the trench etch process.

8. The method of claim 1, wherein a chamfer angle (0) is formed within a surface for one or more corners of the one or more ULK features.

9. The method of claim 8, wherein the chamfer angle (0) is formed such that 85°<0<90°.

10. The method of claim 8, wherein the chamfer angle (0) is formed such that 40°<0<85°.

11. The method of claim 1, wherein the protective layer is partially removed after the deposition process to leave one or more pillars protecting the one or more ULK features.

12. The method of claim 11, further comprising controlling a height for the one or more pillars using a thickness for the organic layer prior to the deposition process.

13. The method of claim 12, wherein the height for the one or more pillars is selected based upon a depth for the trench formed in the etch process.

14. The method of claim 1, wherein the organic ash process partially removes the protective layer to leave one or more protective plugs to protect the one or more ULK features.

15. The method of claim 14, wherein the protective layer is an organic film.

16. The method of claim 1, wherein the deposition process forms a thin protective layer that covers the patterned structure and partially fills the one or more vias.

17. The method of claim 16, wherein the thin protective layer is an organic film and wherein the organic ash process partially removes the thin protective layer.

18. The method of claim 17, wherein the deposition process and the organic ash process are cyclically repeated until the one or more vias are filled within the organic film leaving one or more protective plugs to protect the one or more ULK features.

19. The method of claim 1, wherein the organic ash process is performed to remove the organic layer before the deposition process is performed to form the protective layer.

20. The method of claim 19, wherein the organic ash process partially removes the protective layer to leave one or more protective plugs to protect the one or more ULK features.

21. The method of claim 20, wherein the protective layer is an organic film.

22. The method of claim 1, further comprising performing a metallization process to form a metal layer over the ULK feature.

23. The method of claim 22, wherein the metal layer comprises copper.

24. The method of claim 1, wherein the one or more ULK features have a dielectric constant (k) of 3.3 or less such that $k<3.3$.

25. The method of claim 1, wherein the one or more ULK features have a dielectric constant (k) of 2.0 to 3.3 such that $2.0<k<3.3$.

* * * * *

UNITED STATES PATENT AND TRADEMARK OFFICE
CERTIFICATE OF CORRECTION

PATENT NO. : 10,304,725 B2
APPLICATION NO. : 15/665515
DATED : May 28, 2019
INVENTOR(S) : Xinghua Sun et al.

Page 1 of 1

It is certified that error appears in the above-identified patent and that said Letters Patent is hereby corrected as shown below:

Column 9, Lines 14-15, change "below, these regions may correspond to specific process plasma process conditions" to --below, these regions may correspond to specific plasma process conditions--.

Column 9, Lines 18-19, change "processing apparatus may be configured to provide localize plasma process conditions" to --processing apparatus may be configured to provide localized plasma process conditions--.

Column 10, Line 46, change "This ash process step could be also be performed by" to --This ash process step could also be performed by--.

Column 12, Lines 1-2, change "helium, hydrogen, methane, and/or other gases under of variety of pressure, power," to --helium, hydrogen, methane, and/or other gases under a variety of pressure, power,--.

Column 12, Lines 15-16, change "argon, helium, hydrogen, methane, and/or other gases under of variety of pressure," to --argon, helium, hydrogen, methane, and/or other gases under a variety of pressure,--.

Column 15, Line 52, Claim 8, change "The method of claim 1, wherein a chamfer angle (o) is" to --The method of claim 1, wherein a chamfer angle ($\theta$) is--.

Column 16, Line 1, Claim 9, change "The method of claim 8, wherein the chamfer angle (o)" to --The method of claim 8, wherein the chamfer angle ($\theta$)--.

Column 16, Line 3, Claim 10, change "The method of claim 8, wherein the chamfer angle (o)" to --The method of claim 8, wherein the chamfer angle ($\theta$)--.

Signed and Sealed this
Thirteenth Day of August, 2019

Andrei Iancu
*Director of the United States Patent and Trademark Office*